United States Patent
Sreeram et al.

(10) Patent No.: US 11,605,408 B1
(45) Date of Patent: Mar. 14, 2023

(54) MERGED COMMAND DECODER FOR HALF-FREQUENCY CIRCUITS OF A MEMORY DEVICE

(71) Applicant: Micron Technology, Inc., Boise, ID (US)

(72) Inventors: Navya Sri Sreeram, Plano, TX (US); Kallol Mazumder, Dallas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/518,153

(22) Filed: Nov. 3, 2021

(51) Int. Cl.
*G11C 7/22* (2006.01)
*G11C 7/10* (2006.01)

(52) U.S. Cl.
CPC .......... *G11C 7/222* (2013.01); *G11C 7/1039* (2013.01); *G11C 7/1063* (2013.01); *G11C 7/1096* (2013.01)

(58) Field of Classification Search
CPC ........................................................ G11C 7/22
USPC ....................................................... 365/233.1
See application file for complete search history.

(56) References Cited

U.S. PATENT DOCUMENTS

| | | | | | |
|---|---|---|---|---|---|
| 5,717,909 | A | * | 2/1998 | Nemirovsky | G06F 11/3648 712/E9.055 |
| 6,130,631 | A | * | 10/2000 | Redford | G06T 9/00 341/67 |
| 2004/0139258 | A1 | * | 7/2004 | Chambers | G06F 13/4291 710/110 |
| 2007/0051806 | A1 | * | 3/2007 | Fujimoto | G11C 5/143 235/441 |
| 2018/0219562 | A1 | * | 8/2018 | Lee | H03M 13/098 |

* cited by examiner

*Primary Examiner* — Muna A Techane
(74) *Attorney, Agent, or Firm* — Fletcher Yoder, P.C.

(57) ABSTRACT

A memory device includes a command interface configured to receive a command from a host device via multiple command address bits. The memory device also includes a merged command decoder configured to receive the command and to determine whether the command matches a bit pattern corresponding to multiple command types. The merged command decoder is also configured to, in response to the command matching the bit pattern, asserting a latch signal. The memory device also includes a latch configured to capture the multiple command address bits based at least in part on assertion of the latch signal.

21 Claims, 7 Drawing Sheets

| FUNCTION | ABBREVIATION | CS | CA0 | CA1 | CA2 | CA3 | CA4 |
|---|---|---|---|---|---|---|---|
| WRITE PATTERN (ZERO) 224 | WRP | L | H | L | L | H | L |
| | | H | V | C3 | C4 | C5 | C6 |
| WRITE 226 | WR | L | H | L | H | H | L |
| | | H | C2 | C3 | C4 | C5 | C6 |

230

220 → 228

| FUNCTION | ABBREVIATION | CS | CA 0 | CA 1 | CA 2 | CA 3 | CA 4 |
|---|---|---|---|---|---|---|---|
| WRITE PATTERN (ZERO) 224 | WRP | L | H | L | L | H | L |
| | | H | V | C3 | C4 | C5 | C6 |
| WRITE 226 | WR | L | H | L | H | H | L |
| | | H | C2 | C3 | C4 | C5 | C6 |

MERGED COMMAND DECODER FOR HALF-FREQUENCY CIRCUITS OF A MEMORY DEVICE

BACKGROUND

Field of the Present Disclosure

Embodiments of the present disclosure relate generally to the field of semiconductor devices. More specifically, embodiments of the present disclosure relate to a merged command decoder for half-frequency circuits of a memory device.

Description of Related Art

Semiconductor devices (e.g., memory devices) utilize timings with shifts of data signals, data strobes, commands, and/or other signals to perform operations. The commands are decoded and captured using command address bits. Some memory devices utilize two-cycle commands, like Write (WR) and Write Pattern (WRP) commands, using common address bits that are to be captured in the second cycle based on the decoded commands. At higher speeds of some newer memory devices, capturing these common address bits in the second cycle is challenging to complete properly in the allotted time. Furthermore, process voltage temperature (PVT) variations reduce a window for the address bits further complicating capture of the command address bits. For three-dimensional stacked (3DS) circuits, signals may pass through wire-bonds adding further variations thereby further reducing this window. In other words, as the window shrinks, the command address bits become harder to capture. At higher frequencies, this capture may be impractical or impossible in at least some memory devices.

Embodiments of the present disclosure may be directed to one or more of the problems set forth above.

BRIEF DESCRIPTION OF DRAWINGS

FIG. 5 is a table of encoded commands with a common bit pattern between the two commands, in accordance with an embodiment;

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously noted, shared command address bits may be difficult to capture in subsequent cycles after a decode of initial bits due to various factors, such as memory device speed, PVT variations, and 3DS structures. To address the narrower timing requirements, the memory device may capture common bits for two or more commands (e.g., WR and WRP). However, if the different command paths for the two commands are not matched properly, then at fast clock cycles (tCKs), it becomes difficult to meet setup/hold timing requirements in the address latch for these commands. Further, this matching may be impractical or impossible in at least some memory devices. Some memory devices may be half-frequency devices that utilize two pipelines (even and odd) that run at reduced speeds (i.e., half of system clock) and use alternating pulses of the system clock. Since the reduced speed increases the command address bit timing window, the half-frequency common command paths need not be matched. However, splitting the commands between the dual pipelines may duplicate (e.g., double) at least some circuitry (e.g., command decoders) for each of the pipelines. To alleviate the necessity of this additional pipeline circuitry, some memory devices may collapse some circuitry (e.g., command decoder) to decode a single result from common bit patterns that are common between both commands to flag that one of the two commands has been received. In other words, the two commands share a pattern in all but one (or more) command address bit. The decoder determines that one of the two commands has been received and captures the common command bits in a second cycle. The remaining bit(s) (e.g., CA<2>) that differ between the two commands may also be captured and used to differentiate between the two commands downstream for the second cycle bits. In some embodiments, the second cycle command may be delayed, but such delays may be compensated for using walk-back clocking.

Figure 1:
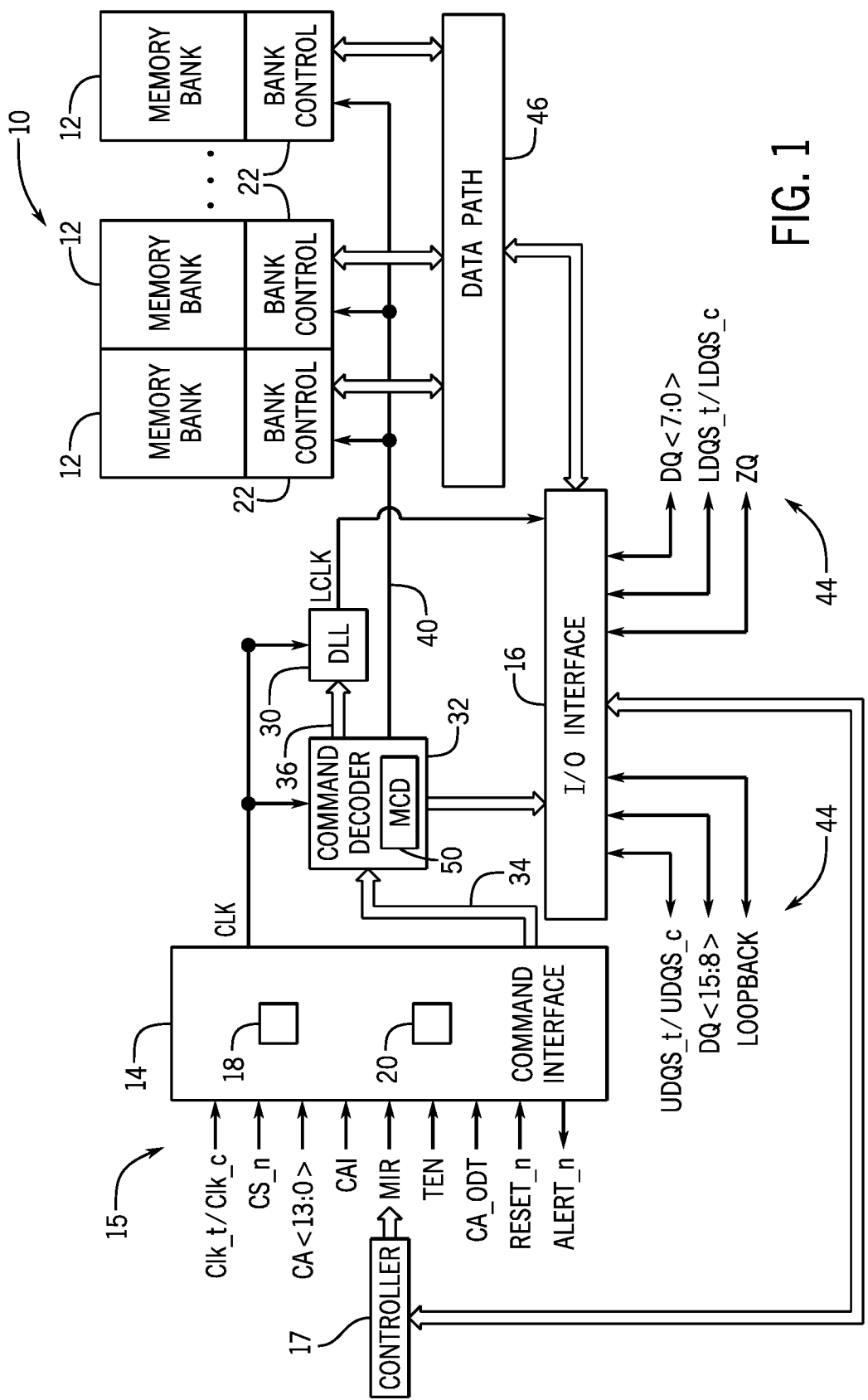
FIG. 1 is a simplified block diagram illustrating certain features of a memory device having merged command decoder, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a DDR5 SDRAM device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (110) interface 16. The command interface 14 is configured to provide a number of signals (e.g., signals 15) from an external host device, such as a controller 17 that may be embodied as a processor and/or other host device. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary or bar clock signal (Clk_c). The positive clock edge for DDR refers to the point where the rising true clock signal Clk_t crosses the falling bar clock signal Clk_c, while the negative clock edge indicates that transition of the falling true clock signal Clk_t and the rising of the bar clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the bar clock signal (Clk_c) and generates an internal clock signal CLK. The internal clock signal CLK is supplied to an internal clock generator, such as a delay locked loop (DLL) 30. The DLL 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. Additionally or alternatively, the command decoder may send internal write signals 41 to the IO interface 16. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands. As previously discussed, the command decoder 32 may include at least one merged command decoder (MCD) 50 that decodes multiple commands (e.g., WR and WRP) using common command address bits to reduce pipeline redundancy when using half-frequency commands to enhance 2-cycle command captures.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving signals 44 (e.g., data and/or strobes to capture the data) through the IO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS. The DQS is driven by the external processor or controller sending the data (e.g., for a write command) or by the memory device 10 (e.g., for a read command). For read commands, the DQS is effectively additional data output (DQ) signals with a predetermined pattern. For write commands, the DQS is used as clock signals to capture the corresponding input data. As with the clock signals (Clk_t and Clk_c), the DQS may be provided as a differential pair of data strobe signals (DQS_t and DQS_c) to provide differential pair signaling during reads and writes. For certain memory devices, such as a DDR5 SDRAM memory device, the differential pairs of DQS may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
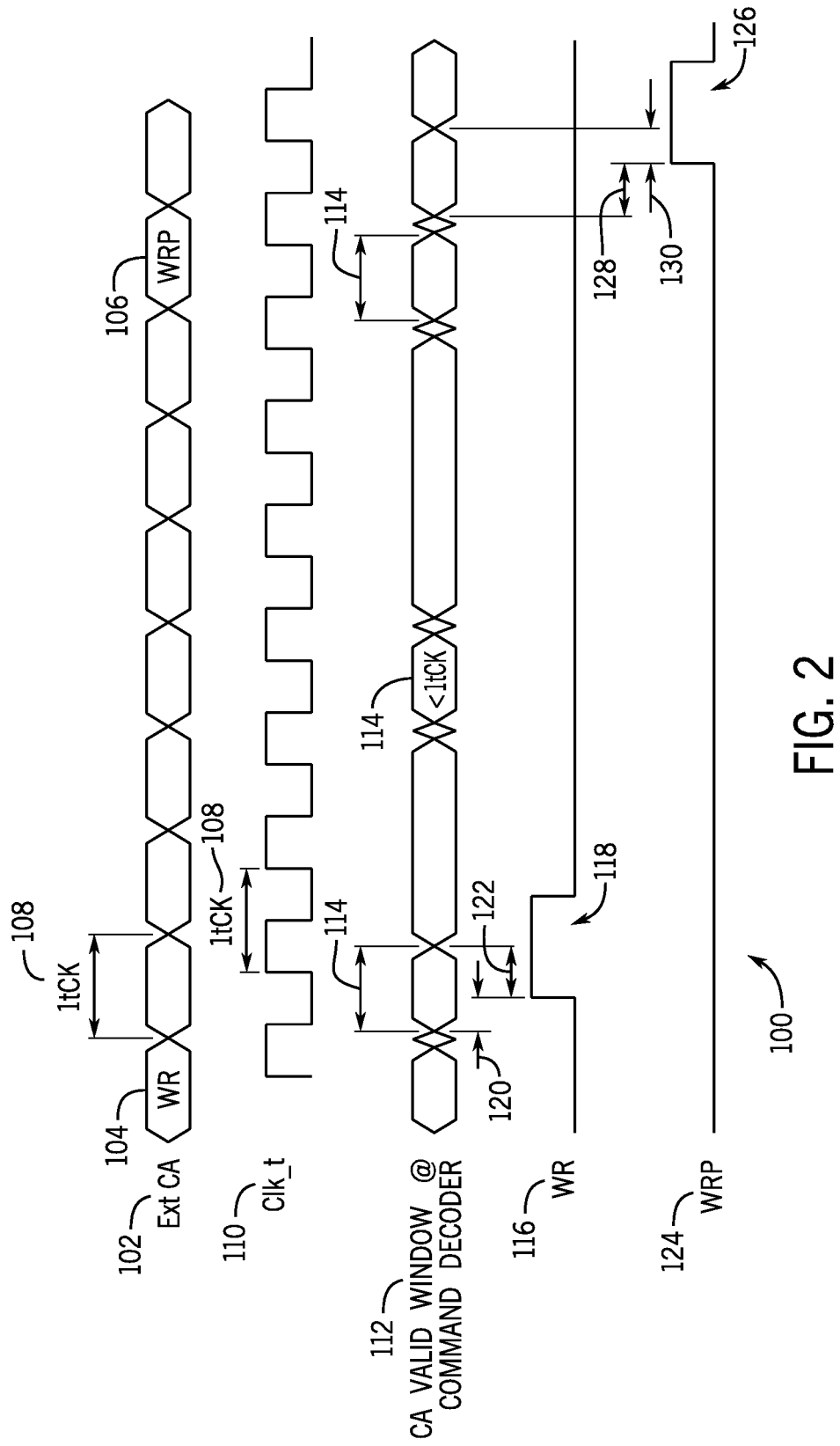
FIG. 2 is a timing diagram showing capturing of the common address bits for two different command types, in accordance with an embodiment.

FIG. 2 is a timing diagram 100 for two commands using separate decoders used to decode unique command address bits to determine a specific command. The timing diagram 100 includes external command address bits 102 with their corresponding commands. At least some of the external command address bits 102 specify a specific command, such as a write (WR) command 104 and a write pattern (WRP) command 106. Each command may be asserted for one or more clock cycles (tCK) 108 of the true clock signal (Clk_t) 110. For instance, for a clock of 3200 MHz, 1 tCK may be 312 ps, but other clock frequencies and tCKs may be suitable in some memory devices. The timing diagram 100 also shows a window 112 at the command decoder 32. The window 112 shows a valid command address window where the command address bits may be captured properly. As illustrated, at least some windows 112 have a duration 114 that is less than 1 tCK. For example, the duration 114 may be 260 ps or any other value less than 312 ps for a 3200 MHz clock.

The timing diagram 100 also shows a first command 116. For instance, the first command 116 may correspond to the WR command that is decoded from the WR command 104 from the external command address bits 102 and that arrives at a latch, as illustrated by a pulse 118. As illustrated, a rising edge of the pulse 118 has a setup time 120 from the beginning of the corresponding window 112 and a hold time 122 until an end of the corresponding window 112. For instance, the setup time 120 may be 150 ps while the hold time 122 may be 110 ps.

The timing diagram 100 also shows a second command 124. For instance, the second command 124 may include the WRP command that is decoded from the WRP command 106 from the external command address bits 102 and that arrives at a latch, as illustrated by a pulse 126. As illustrated, a rising edge of the pulse 126 has a setup time 128 from the beginning of the corresponding window 112 and a hold time 130 until an end of the corresponding window 112. For instance, the setup time 128 may be 200 ps while the hold time 130 may be 60 ps. In some specifications, the hold time 130 may be outside of specification meaning that the capturing time has failed and/or may fail for the second command 124. The column address may be delayed to cause capturing the second command 124 to pass. However, this delay may cause the first command 116 to fail capture. Accordingly, either both command paths should be matched more finely or both the column address and the first command 116 must be delayed. However, adding delay gates to the critical path introduces additional PVT variations.

Figure 3:
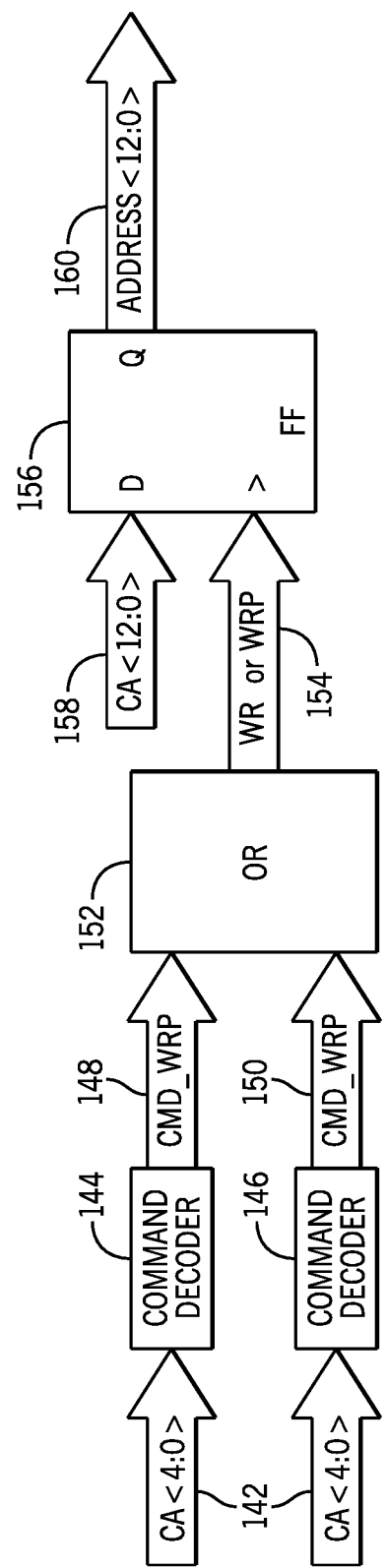
FIG. 3 is a block diagram of circuitry that may be used to implement the timing diagram of FIG. 2, in accordance with an embodiment.

FIG. 3 is a block diagram 140 of circuitry used to decode and capture the command address bits based on decoded commands. A first portion (e.g., 5 of 12 or 13) of bits 142 of the CA bits is received at command decoders 144 and 146. The command decoder 144 decodes a first type of command (e.g., WRP commands) to generate and output a first decoded command signal 148 (e.g., CMD_WRP). The command decoder 146 decodes a second type of command (e.g., WR commands) to generate and output a second decoded command signal 150. Since either command type being decoded indicates that a second portion of CA bits 158 are to be captured in a second cycle, the first decoded command signal 148 and the second decoded command signal 150 are transmitted to an OR gate 152. If either the first decoded command signal 148 or the second decoded command signal 150 is asserted, an output of the OR gate 152 WRorWRP 154 is asserted. This output of the OR gate 152 is transmitted to a flip-flop 156 as a clock of the flip-flop 156. Thus, an assertion of the WRorWRP 154 is used to capture the CA bits 158 into the flip-flop 156 to latch and output a captured address 160. Since both command types are used to capture the common second portion of CA bits 158, the two paths must be matched properly to ensure that the second portion of CA bits 158 are captured properly. Any failure in the mismatch may be at least partially due to PVT variations, the use of 3DS, and/or clock speeds for the memory device.

Figure 4:
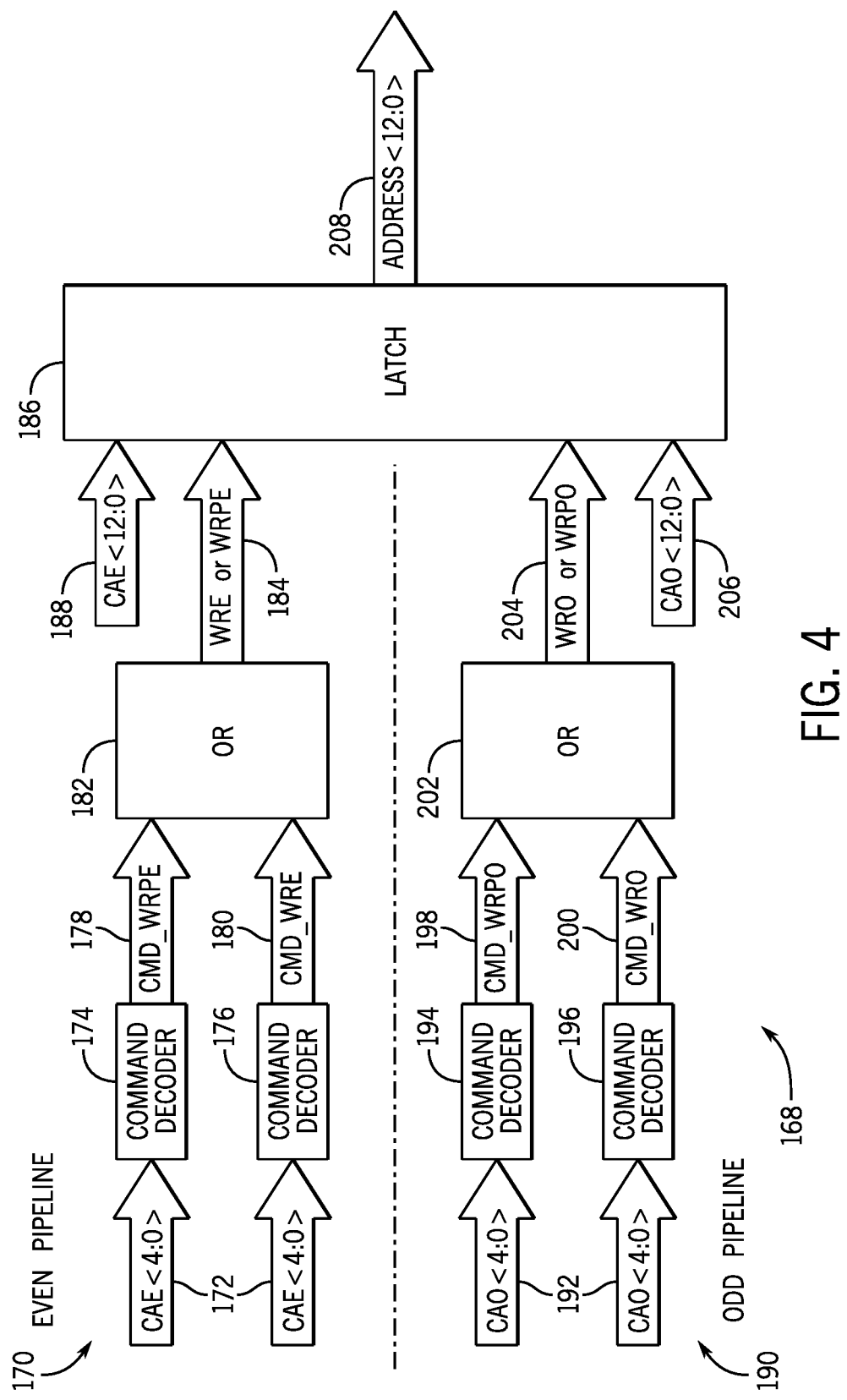
FIG. 4 is a block diagram of a half-frequency mode for a memory device that includes an even pipeline and an odd pipeline that has reduced matching requirements compared to FIG. 3 but has double the number of command decoders, in accordance with an embodiment.

To ensure that the CA bits 158 are captured properly, the incoming commands may be split between a number N (e.g., two) pipelines that operate at a lower frequency of 1 tCK/N to expand the window 112. FIG. 4 is a block diagram 168 of circuitry used to decode and capture the command address bits using a decoded command via half-frequency circuitry.

An even pipeline 170 receives a first portion (e.g., 5 of 13) of bits 172 of the CA bits at command decoders 174 and 176. The command decoder 174 decodes a first type of command (e.g., WRP even (WRPE) commands) to generate and output a first decoded command signal 178 (e.g., CMD_WRPE) for the even pipeline 170. The command decoder 176 decodes a second type of command (e.g., WR even (WRE) commands) to generate and output a second decoded command signal 180 (e.g., CMD_WRE). Since either command type being decoded indicates that a second portion of CA bits 188 are to be captured in a second cycle of the even pipeline 170, the first decoded command signal 178 and the second decoded command signal 180 are transmitted to an OR gate 182. If either the first decoded command signal 178 or the second decoded command signal 180 is asserted, an output 184, WRE or WRPE, of the OR gate 182 is asserted. An assertion of this output 184 of the OR gate 182 is transmitted to a latch 186 and is used to capture the CA bits 188 into the latch 186 to capture the command address bits in the even pipeline 170.

An odd pipeline 190 receives a first portion (e.g., 5 of 13) of bits 192 of the CA bits at command decoders 194 and 196. The command decoder 194 decodes a third type of command (e.g., WRP odd (WRPO) commands) to generate and output a third decoded command signal 198 (e.g., CMD_WRPO). The command decoder 196 decodes a fourth type of command (e.g., WR odd (WRO) commands) to generate and output a fourth decoded command signal 200 (e.g., CMD_WRO). Since either of the third or fourth command types being decoded indicates that CA bits 206 are to be captured in the latch 186 in a second cycle, the third decoded command signal 198 and the fourth decoded command signal 200 are transmitted to an OR gate 202. If either the third decoded command signal 198 or the fourth decoded command signal 200 are asserted, an output 204, WRO or WRPO, of the OR gate 202 is asserted. This assertion of the output 204 of the OR gate 202 is transmitted to the latch 186 and is used to capture the third portion of CA bits 206 into the latch 186. As illustrated, the latch 186 may be a special use latch that is used to latch from both the even pipeline 170 and the odd pipeline 190 to generate a latched address 208. As previously discussed, this half-frequency implementation may double the width of the window 112 enabling the memory device 10 to have less precise matching between the paths of the different pairs of command types. However, the duplication (e.g., doubling) of circuitry between the dual pipelines in FIG. 4 compared to FIG. 3 increases cost and/or area costs in the memory device 10.

However, this implementation of additional circuitry due to dual pipelines may be mitigated using a merged command decoder that outputs an indication of whether two or more commands are received that are used to indicate that at least some command address bits are to be captured in a second cycle after the decoded command bits are captured in a first cycle. The command bits captured in the first cycle may be recaptured in the second cycle or may be replaced with other values from the second cycle.

FIG. 5 shows a table 220 with two commands 224 and 226 that share common bits 228 in the first cycle except for a single bit 230. Decoding either of these commands 224 and 226 indicate that additional bits (e.g., CA<12:0>) are to be captured from the command address bus. Accordingly, a single merged command decoder may be used to quickly determine whether the additional bits are to be captured from the command address bus for either of the commands. To maintain separation between the two commands, the bit(s) (e.g., bit 230) may be sent downstream to distinguish the commands 224 and 226 from each other later in the pipeline.

Figure 6:
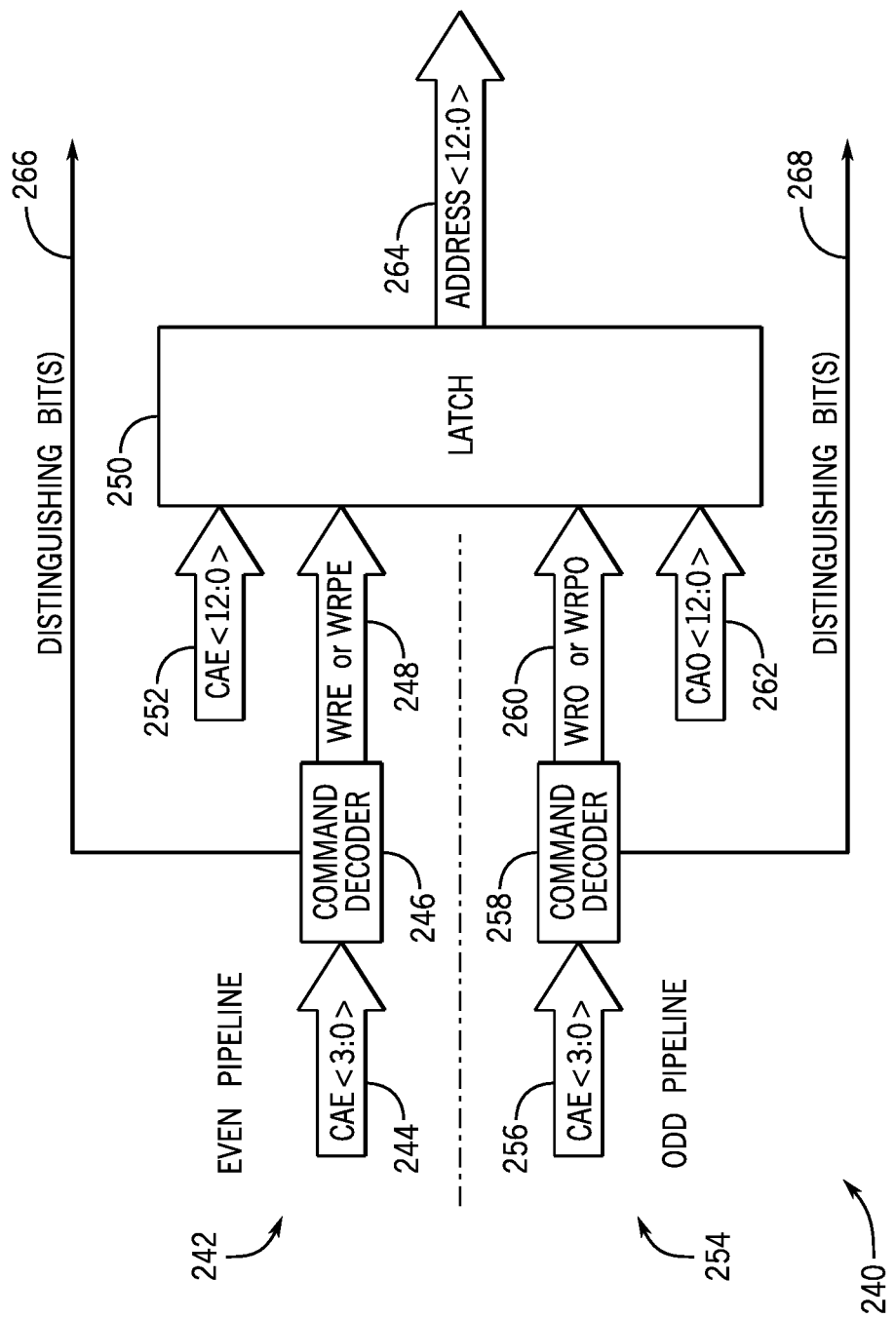
FIG. 6 is a block diagram of a half-frequency mode for a memory device that includes an even pipeline and an odd pipeline that utilizes merged command decoders, in accordance with an embodiment.

FIG. 6 is a block diagram 240 of circuitry used to decode and capture the command address bits using one or more merged command decoders. An even pipeline 242 receives a first portion 244 (e.g., 5 of 13) of bits of the CA bits at a merged command decoder 246. The merged command decoder 246 decodes that an incoming command (e.g., WR and WRPE commands) matches a pattern in the even pipeline 242. For instance, all but a number (e.g., 1, 2, 3, or more) of the incoming command bits match a specific bit pattern. When the bit pattern is detected, the merged command decoder 246 indicates that the incoming command is one of the commands corresponding to the pattern. Furthermore, since the commands corresponding to the pattern indicate that additional bits are to be captured from the command bus, the merged command decoder 246 outputs a latch signal 248 that causes a latch 250 to capture bits (e.g., CA<12:0>) 252 from the even pipeline 242 in a subsequent (e.g., second) clock cycle.

An odd pipeline 254 receives a first portion 256 (e.g., 5 of 13) of bits of the CA bits of the command bus at a merged command decoder 258. Like the merged command decoder 246, the merged command decoder 258 decodes that an incoming command (e.g., WR and WRPO commands) matches a pattern but in the odd pipeline 254. For instance, all but a number (e.g., 1, 2, 3, or more) of the incoming command bits match a specific bit pattern. The specific bit pattern may be the same for the merged command decoders 246 and 258. When the bit pattern is detected, the merged command decoder 258 indicates that the incoming command is one of the commands corresponding to the pattern. Furthermore, since the commands corresponding to the pattern indicate that bits are to be captured from the command bus, the merged command decoder 258 outputs a latch signal 262 that causes the latch 250 to capture bits (e.g., CA<12:0>) 262 from the odd pipeline 254 in a subsequent clock cycle.

The most recent value latched in the latch 250 is output as output column address bits 264. However, since the output of the merged command decoders 246 and 258 are generic to at least two commands each, distinguishing bit(s) 266 and/or 268 may be sent downstream to distinguish the commands when their resulting operations are to be performed. In some embodiments, the merged command decoder 246 may drive the distinguishing bit(s) 266 based on received values when the latch signal 248 is asserted, and the merged command decoder 258 may drive the distinguishing bit(s) 268 based on received values when the latch signal 262 is asserted. Otherwise, the merged command decoder 246 and merged command decoder 258 may hold their outputs at some predetermined value that indicates that no output is transmitted. Alternatively, both distinguishing bit(s) 266 and 268 may be driven with a logic gate used to gate its output by ORing the distinguishing bit(s) 266 with the latch signal 248 and ORing the distinguishing bit(s) 268 with the latch signal 262 and ORing the results of such OR gates as a transmitted OR output. Although the distinguishing bit(s) 266 and 268 are shown as transmitted from the respective merged command decoders 246 and 258, other embodiments of the memory device 10 may derive the distinguishing bit(s) 266 and/or 268 from other locations in the respective even pipeline 242 and odd pipeline 254. For instance, the distinguishing bit(s) 266 and 268 may be hardwired to respective bits of the incoming portions 244 and 256 that may differ in commands corresponding to the merged command decoders 246 and 258.

As previously discussed, this half-frequency implementation may double the width of the window 112 enabling the memory device 10 to have less precise matching between the paths of the different pairs of command types. However, the circuitry of FIG. 6 provides such benefit without the doubling of circuitry implemented in FIG. 4 compared to FIG. 3.

Figure 7:
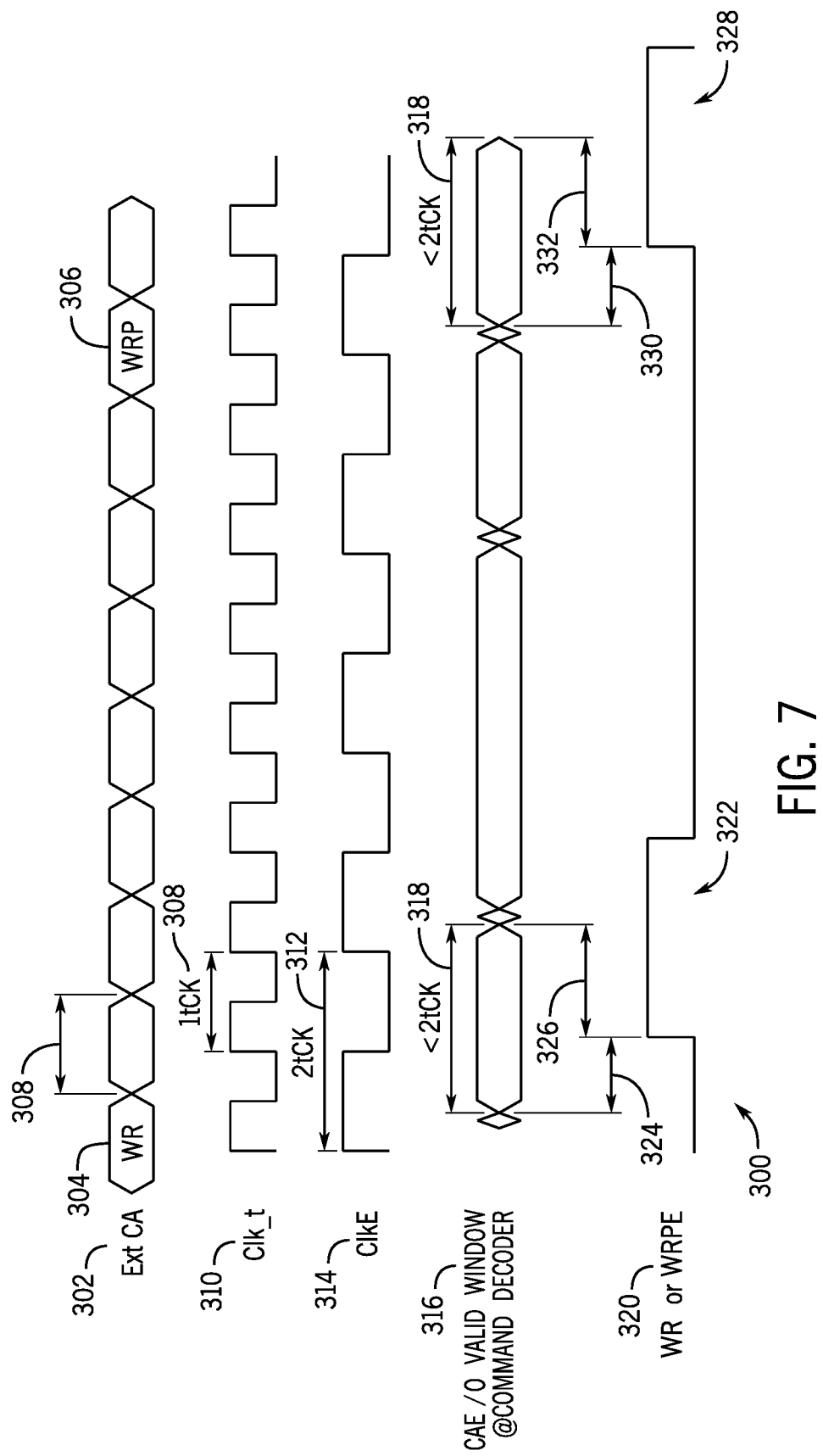
FIG. 7 is a timing diagram of the half-frequency mode of FIG. 6, in accordance with an embodiment.

FIG. 7 is a timing diagram 300 for two commands using a merged decoder used to decode patterns of command address bits to determine that a received command is one of multiple (e.g., 2) commands that correspond to the pattern. The timing diagram 300 includes external command address bits 302 with their corresponding commands. The command address bits specify a specific command, such as a write (WR) command 304 and a write pattern (WRP) command 306. Each command may be asserted for one or more clock cycles (tCK) 308 of the true clock signal (Clk_t) 310. For instance, for a clock of 3200 MHz, 1 tCK may be 312 ps, but other clock frequencies and tCKs may be suitable in some memory devices. Since the memory device 10 of FIG. 6 is a half-frequency circuit, the timing diagram 300 includes an even clock 314 that has a clock cycle 312 of 2 tCKs used for the even pipeline 242. Although the odd clock is not shown for the odd pipeline 254, the odd clock has the same frequency as the even clock and is 180 degrees out of phase.

The timing diagram 300 also shows a valid window 316 that has a duration 318 at the merged command decoders 246 and 258. The windows 316 show a valid command address window where the command address bits may be captured properly. As illustrated, each window 316 has a duration 318 that is less than 2 tCK (e.g., 570 ps). In other words, the capture window is expanded using the half-frequency pipelining without the additional command decoders used in FIG. 4. In other words, a memory device 10 utilizing the merged command implementation may have a much smaller layout size and/or cost associated with a memory device that utilizes the command decoders of FIG. 4. However, other factors may be used to select the embodiment of FIG. 4 for implementation in at least some memory devices 10.

The timing diagram 300 also shows a merged command line 320 that corresponds to the latch signal 248. The latch signal 248/merged command line 320 may be used to indicate whether a first command type (e.g., WR command) or a second command type (e.g., WRP command) is decoded and transmitted to the latch 260. In some embodiments, the latch signals 248 and 260 may correspond to more than two command types. When one of the command types corresponding to the latch signal 248/merged command line 320 is received, the latch signal 248/merged command line 320 has a corresponding pulse. For instance, a pulse 322 corresponds to the first command type while a pulse 328 corresponds to a second command type. As illustrated, a rising edge of the pulse 322 has a setup time 324 from the beginning of the corresponding window 316 and a hold time 326 until an end of the corresponding window 316. For instance, the setup time 324 may be 200 ps while the hold time 326 may be 370 ps. As illustrated, a rising edge of the pulse 328 has a setup time 330 from the beginning of the corresponding window 316 and a hold time 332 until an end of the corresponding window 316. For instance, the setup time 330 may be 200 ps while the hold time 332 may be 370 ps. In some specifications, the hold time 332 may be outside of specification when using a full-frequency circuit but not in the half-frequency circuit illustrated in FIG. 6 due to the expanding duration 318.

Merging command decoding means a common signal carries information of two or more commands, such as WR and WRP commands. As previously noted, these commands may be separated down the pipeline as both have different functions to perform. For example, a WR command collects data from DQ and writes it into the memory array. Whereas, a WRP command collects data/patterns stored in registers and writes them into the memory array. As previously noted, differentiating the two commands may be easily achieved by capturing one or more bit(s) (e.g., CA<2> bit) with first cycle command capture. For example, the CA<2> may be low for WRP and high for WR. This captured CA<2> bit may then be used to differentiate second cycle command information into separate WR or WRP command while properly capturing the second cycle command information. In order to achieve this separation, the second cycle common command may be delayed. Delaying high-speed logic command may be unproblematic as half-frequency circuits may provide enough setup-margin for adaptive walk-back schemes. Thus, this delayed 2-tCk wide command can be captured by the delayed walk-back clock. The step-size of such a half-frequency circuit-based walk-back scheme is twice the step-size of full-frequency. Therefore, such walk-back schemes may be implemented without any additional delay stages to the walkback scheme to compensate for the latency due to command separation.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
    a command interface configured to receive a command from a host device via plurality of command address bits; and
    a merged command decoder configured to:
    receive the command;

determine whether the command matches a bit pattern corresponding to a plurality of command types; and in response to the command matching the bit pattern, assert a latch signal; and a latch configured to capture the plurality of command address bits based at least in part on assertion of the latch signal.

2. The memory device of claim 1, wherein the latch is configured to capture the plurality of command address bits in a subsequent cycle of a system clock after a cycle of the system clock used to receive the command.

3. The memory device of claim 1, wherein the plurality of command types comprises a write command and a write pattern command, and the command is a write command.

4. The memory device of claim 1, wherein the plurality of command types comprises a write command and a write pattern command, and the command is a write pattern command.

5. The memory device of claim 1, comprising a first pipeline using a first clock divided from a system clock and a second pipeline using a second clock divided from the system clock.

6. The memory device of claim 5, wherein the merged command decoder is in the first pipeline.

7. The memory device of claim 6, wherein the second pipeline comprises a second merged command decoder configured to:
receive a second command;
determine whether the second command matches a second bit pattern corresponding to a second plurality of command types; and
in response to the second command matching the second bit pattern, assert a second latch signal, wherein the latch is configured to capture bits based at least in part on assertion of the second latch signal.

8. The memory device of claim 7, wherein the bit pattern and the second bit pattern match.

9. The memory device of claim 7, wherein the plurality of command types comprises write and write pattern commands, and the second plurality of command types comprises write and write pattern commands.

10. The memory device of claim 7, comprising a transmission path configured to transmit a bit of the second command not in the second bit pattern down the second pipeline to distinguish between the second plurality of command types.

11. The memory device of claim 1, comprising a transmission path configured to transmit a bit of the command not in the bit pattern down a pipeline to enable the memory device to distinguish between the plurality of command types.

12. A memory device, comprising:
an even pipeline configured to receive an even command captured from a plurality of command address bits using an even clock divided from a system clock, wherein the even pipeline comprises an even merged command decoder configured to:
receive the even command;
determine whether the even command matches a first bit pattern corresponding to a first plurality of command types; and
in response to the even command matching the first bit pattern, assert a first latch signal; and
an odd pipeline configured to receive an odd command captured from the plurality of command address bits using an odd clock divided from the system clock, wherein the odd pipeline comprises an odd merged command decoder configured to:
receive the odd command;
determine whether the odd command matches a second bit pattern corresponding to a second plurality of command types; and
in response to the odd command matching the second bit pattern, assert a second latch signal; and
a latch configured to capture even command bits of the plurality of command address bits corresponding to the even pipeline based at least in part on assertion of the first latch signal and to capture odd command bits of the plurality of command address bits corresponding to the odd pipeline based at least in part on assertion of the second latch signal.

13. The memory device of claim 12, wherein the first plurality of command types is the same as the second plurality of command types.

14. The memory device of claim 12, wherein the first plurality of command types comprises write and write pattern commands.

15. The memory device of claim 12, wherein the second plurality of command types comprises write and write pattern commands.

16. The memory device of claim 12, comprising an even transmission line configured to transmit a bit that is different between command types of the first plurality of command types.

17. The memory device of claim 12, comprising an odd transmission line configured to transmit a bit that is different between command types of the second plurality of command types.

18. A method of capturing bits in a memory device, comprising:
receiving a plurality of command address bits corresponding to a command at the memory device;
decoding a subset of the plurality of command address bits in a first command decoder to determine whether the command corresponds to a bit pattern corresponding to both a first command type and a second command type; and
based on a determination that the command corresponds to the bit pattern, transmitting a latch signal from the first command decoder to a latch configured to capture at least some of the plurality of command address bits based on the latch signal.

19. The method of claim 18, wherein the first command type comprises a write command, and the second command type comprises a write pattern command.

20. The method of claim 18, wherein the command is captured in a first pipeline of the memory device.

21. The method of claim 19, comprising:
receiving a subsequent plurality of command address bits corresponding to a subsequent command at a second pipeline of the memory device;
decoding a subsequent subset of the plurality of command address bits in a second command decoder in the second pipeline to determine whether the subsequent command corresponds to the bit pattern; and
based on a determination that the subsequent command corresponds to the bit pattern, transmitting an additional latch signal from the second command decoder to a latch configured to capture at least some of the plurality of command address bits based on the additional latch signal.

* * * * *